(12) United States Patent
Mishra et al.

(10) Patent No.: US 8,963,610 B2
(45) Date of Patent: Feb. 24, 2015

(54) ADAPTABLE MIXER AND LOCAL OSCILLATOR DEVICES AND METHODS

(75) Inventors: Chinmaya Mishra, San Diego, CA (US); Hongyan Yan, San Diego, CA (US); Junxiong Deng, Grandville, MI (US)

(73) Assignee: QUALCOMM Incorporated, San Diego, CA (US)

( * ) Notice: Subject to any disclaimer, the term of this patent is extended or adjusted under 35 U.S.C. 154(b) by 56 days.

(21) Appl. No.: 13/468,696

(22) Filed: May 10, 2012

(65) Prior Publication Data

US 2013/0300489 A1 Nov. 14, 2013

(51) Int. Cl.
*G06F 7/44* (2006.01)
*G06G 7/12* (2006.01)
*H03D 7/14* (2006.01)

(52) U.S. Cl.
CPC .............. *G06G 7/12* (2013.01); *H03D 7/1458* (2013.01); *H03D 7/1483* (2013.01); *H03D 2200/0086* (2013.01)
USPC ............................ 327/355; 455/323; 455/326

(58) Field of Classification Search
USPC ........... 327/355–361; 326/323, 326; 455/323, 455/326
See application file for complete search history.

(56) References Cited

U.S. PATENT DOCUMENTS

| | | | |
|---|---|---|---|
| 7,266,361 B2* | 9/2007 | Burdett | 455/334 |
| 7,519,348 B2 | 4/2009 | Shah | |
| 7,725,088 B2* | 5/2010 | Cha et al. | 455/183.1 |
| 7,982,527 B2* | 7/2011 | Dawe et al. | 327/355 |
| 8,378,732 B2* | 2/2013 | Kousai et al. | 327/355 |
| 8,437,724 B2* | 5/2013 | Pan | 455/296 |
| 2005/0233721 A1 | 10/2005 | Sakurai | |
| 2009/0325510 A1 | 12/2009 | Pullela et al. | |
| 2010/0003943 A1 | 1/2010 | Seendripu et al. | |
| 2010/0041359 A1 | 2/2010 | Liu et al. | |
| 2010/0120377 A1 | 5/2010 | He | |
| 2012/0094620 A1 | 4/2012 | Lu et al. | |

OTHER PUBLICATIONS

Vidojkovic, M., "Configurable circuits and their impact on multi-standard RF frpnt-end architecture," 2011, Doctoral Dissertation: Technishe Universiteit Eindhoven, pp. 1-198. See sections 3.2 to 3.5 and 5.1 to 5.2.
Weldon, et al., "A 1.75-GHz highly integrated narrow-band CMOS transmitter with harmonic-rejection mixers," IEEE J. Solid-State Circuits, vol. 36, No. 12, Dec. 2001, pp. 2003-2015.
International Search Report and Written Opinion—PCT/US2013/040558, International Search Authority—European Patent Office, Nov. 5, 2013.

* cited by examiner

*Primary Examiner* — Dinh Le
(74) *Attorney, Agent, or Firm* — Kenyon S. Jenckes

(57) ABSTRACT

An adaptable mixer device is operable in a first mode and a second mode and includes a first set of mixer units operable in the first mode and a second set of mixer units operable in the second mode. The second set of mixer units includes at least one mixer unit that is common to both the first set of mixer units and the second set of mixer units. The second set of mixer units also includes a plurality of mixer units that are not in the first set of mixer units. Similarly, the first set of mixer units including a plurality of mixer units that are not in the second set of mixer units.

30 Claims, 6 Drawing Sheets

ADAPTABLE MIXER AND LOCAL OSCILLATOR DEVICES AND METHODS

BACKGROUND

1. Field of the Disclosure

This disclosure relates generally to adaptable mixer and local oscillator devices and methods for operating in multiple modes. Particular embodiments relate to a dual mode mixer apparatus with a local oscillator, that have good linearity properties in at least one of the two modes.

2. Related Art

Recent standards and requirements for certain wireless communication systems require a highly linear transmit signal path. For example, stringent spurious emissions specifications for Long Term Evolution (LTE) standards for cellular telephones require a highly linear transmit signal path.

Improvement in linearity, without having a significant impact on other modes of operation (such as legacy 2G/3G modes) of wireless devices is desired for proper multi-mode, multi-band operation. A non-linear local oscillator (LO) and mixer combination is one of the key contributors to spurious emissions.

It is desired to have an LO/mixer combination that is capable of operating in both a legacy mode and in a non-legacy mode (e.g., 4G or LTE), and that has good linearity characteristics in at least the non-legacy mode.

SUMMARY OF THE DISCLOSURE

Various embodiments of the present invention are directed to an adaptable mixer device which is operable with a multi-phase local oscillator (LO) and that can operate in at least two modes. According to an embodiment of the invention, one of the two modes is a highly linear harmonic rejection mixing (HRM) mode appropriate for 4G or LTE operation. However, in other embodiments, the adaptable mixer and local oscillator devices are configured for other suitable modes (for other suitable communication standards and protocols).

An adaptable mixer device according to embodiments of the present invention includes a first set of mixer units operable in the first mode and a second set of mixer units operable in the second mode. The second set of mixer units include at least one mixer unit that is common to both the first set of mixer units and the second set of mixer units. In addition, the second set of mixer units include a plurality of mixer units that are not in the first set of mixer units. Similarly, the first set of mixer units include a plurality of mixer units that are not in the second set of mixer units. In one example embodiment, the adaptable mixer device includes first and second mixer units that, in the second mode, but not in the first mode, are coupled to receive an LO signal of a first phase and an LO signal of a second phase, respectively, and a plurality of mixer units that, in the first mode, are coupled to receive an LO signal of a third phase, where a subset of the plurality of mixer units that are coupled to receive an LO signal in the first mode are also coupled to receive an LO signal in the second mode.

Further embodiments are directed to a method of operating an adaptable mixer device in a first mode and in a second mode, where the adaptable mixer device includes a first set of mixer units, and a second set of mixer units that includes at least one mixer unit that is common to both the first set of mixer units and the second set of mixer units. The method includes setting a first mode for operating the first set of mixer units including the at least one unit that is common to the first set of mixer units and the second set of mixer units, but not operating each other mixing unit of the second set of mixer units; and setting a second mode for operating the second set of mixer units including the at least one unit that is common to the first set of mixer units and the second set of mixer units, but not operating each other mixing unit of the first set of mixer units. The second set of mixer units includes a plurality of mixer units that are not in the first set of mixer units, and the first set of mixer units including a plurality of mixer units that are not in the second set of mixer units.

DETAILED DESCRIPTION

The detailed description set forth below in connection with the appended drawings is intended as a description of various aspects of the present disclosure and is not intended to represent the only aspects in which the present disclosure may be practiced. Each aspect described in this disclosure is provided merely as an example or illustration of the present disclosure, and should not necessarily be construed as preferred or advantageous over other aspects. The detailed description includes specific details for providing a thorough understanding of the present disclosure. However, it will be apparent to those skilled in the art that the present disclosure may be practiced without these specific details. In some instances, well-known structures and devices are shown in block diagram form in order to avoid obscuring the concepts of the present disclosure. Acronyms and other descriptive terminology may be used merely for convenience and clarity and are not intended to limit the scope of the present disclosure.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

Various embodiments of adaptable mixer and local oscillator devices configured for multi-mode operation (such as, but not limited to dual mode operation) are described in detail below. An adaptable mixer device of an embodiment of the present invention can selectively adapt (by changing a mode of operation) to accommodate different communication standards and protocols. According to an example embodiment of the invention, one of the modes is a highly linear harmonic rejection mixing (HRM) mode appropriate for 4G or LTE operation. Certain communication standards, such as, but not limited to 4G specifications, have relatively stringent spurious emission requirements for transmit signals. Accordingly, embodiments of the present invention are configured to provide good linearity performance to meet those stringent requirements, while still being operable in a legacy mode (e.g., 2G/3G) mode. Other embodiments are configured for two or more modes suitable for other communication standards or operational requirements.

Figure 1:
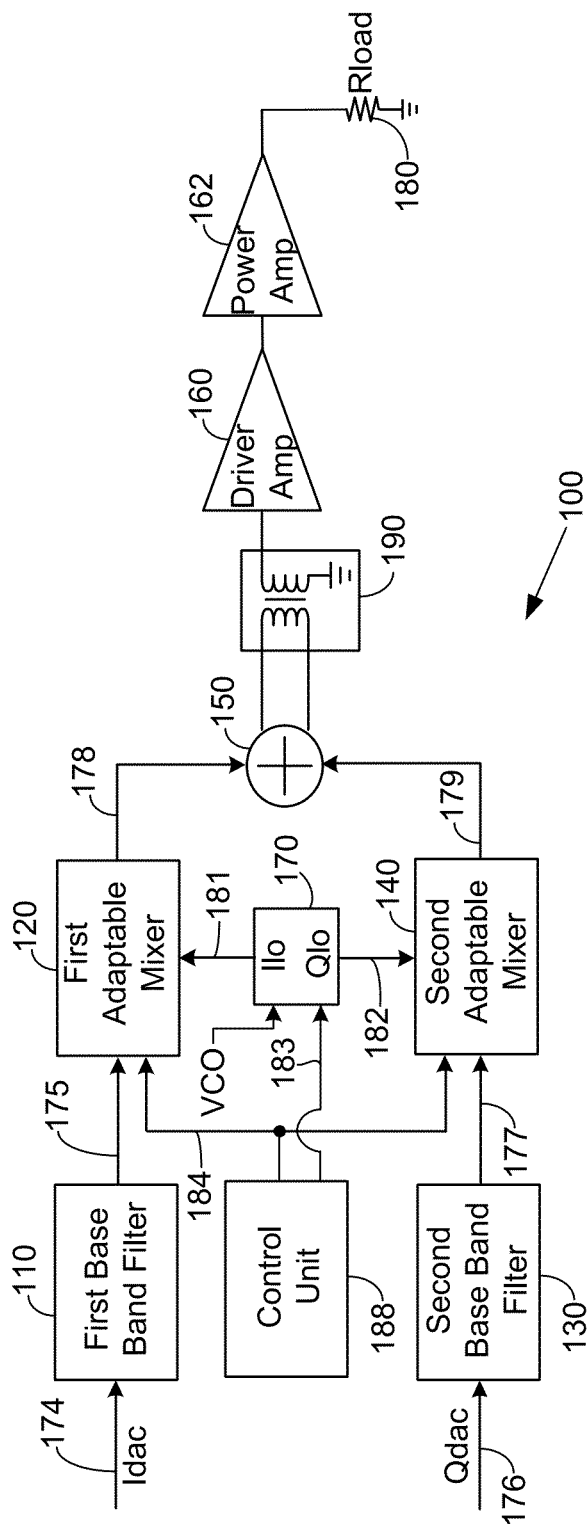
FIG. 1 shows a transmit signal front end for a wireless device, including adaptable mixer devices according to an embodiment of the present invention.

FIG. 1 shows an example of a transmit signal front end system 100 for a wireless device, such as, but not limited to, a wireless telephone or wireless transceiver. The front end system 100 includes adaptable mixer devices 120 and 140 coupled to a local oscillator device 170, configured according to embodiments of the present invention. Embodiments of the present invention relate to the adaptable mixer devices 120, 140 and local oscillator device 170. Further embodiments of the present invention relate to a front end system 100 having an adaptable mixer device 120, 140 and local oscillator device 170.

The transmit signal front end system 100 is used to upconvert a signal to an appropriate frequency band, for transmitting the signal, wirelessly, over-the-air. The transmit signal front end system 100 includes an I (in-phase) path, and a Q (quadrature) path. The I path receives an analog signal Idac on signal line 174 output by a digital-to-analog converter (not shown). The Idac signal with a frequency fbb on line 174 is filtered by a first baseband filter 110. The signal output by the first baseband filter 110 on signal line 175 is provided to a first adaptable mixer device 120, which upconverts the filtered signal to an appropriate frequency. The first adaptable mixer device 120 mixes the output of the first baseband filter 110 with a first oscillation signal (Ilo) output by a local oscillator (LO) device 170 on signal line 181. Control signals are provided to the local oscillator (LO) device 170 through one or more control lines 183 (represented as a single line in FIG. 1), for selecting the phase of the local oscillator (LO) output signal Ilo, as described below with respect to FIG. 5. The control signals on control line(s) 183 are provided by a suitable control unit 188 which, for example, may be included in or associated with the processing electronics (not shown) for the front end system 100.

The Q path receives an analog signal Qdac on signal line 176 output by a digital-to-analog converter (not shown). The Qdac signal with a frequency fbb on line 176 is filtered by a second baseband filter 130. The signal output by the second baseband filter 130 on signal line 177 is provided to a second adaptable mixer device 140, which upconverts the filtered signal to an appropriate frequency. The second adaptable mixer device 140 mixes the output of the second baseband filter 130 with a second oscillation signal (Qlo) output by the local oscillator (LO) device 170 on signal line 182. Control signals are provided to the local oscillator (LO) device 170 through the one or more control lines 183, for selecting the phase of the local oscillator (LO) output signal Qlo, as described below with respect to FIG. 5. The signal lines 181 and 182 represent multiple signal lines for multiple respective phases of the LO signal, for embodiments in which the LO signal is a multiphase signal and/or a differential signal. While certain embodiments described and illustrated herein include a single local oscillator (LO) device 170 to provide both the first and second oscillation signals Ilo and Qlo, in further embodiments, multiple local oscillator devices may be used, such as, but not limited to a different respective local oscillator (LO) device for each respective first and second oscillation signal Ilo and Qlo.

The first and second adaptable mixer devices 120 and 140 are configured to operate in multiple modes, where the mode of operation is selected, based on control signals provided on one or more control lines 184 (represented in FIG. 1 as a single line). The control signals on control line 184 are provided by a suitable control unit 188 which, for example, may be included in or associated with the processing electronics (not shown) for the front end system 100. In the embodiment of FIG. 1, the same control unit 188 is shown as providing control signals to the local oscillator (LO) on control signal line 183 and control signals 184 to the first and second adaptable mixer devices 120, 140. However, in other embodiments, multiple control units may provide the control signals, for example, but not limited to, a first control unit for providing control signals on signal line(s) 183 and one or more second control units for providing control signals on signal line(s) 184.

The output signals 178 and 179 of the first and second mixers 120 and 140, respectively, are added together by an adder 150. In differential signal embodiments, the differential signal output of the adder 150 is provided to a balun 190, which converts a differential signal into a single ended signal (i.e., a balanced input into an unbalanced one). The single ended signal output of the balun 190 is provided as input to a driver amplifier 160, that drives the power amplifier 162 for output as a wireless transmit signal through an antenna 180 (shown in FIG. 1 as $R_{load}$). While the diagram in FIG. 1 shows a line representation for each of the signal lines 174, 175, 176, 177, 178 and 179, the single line in the drawings represents two signal conductors for embodiments in which those lines are for differential signals, and represents a single signal conductor for embodiments in which non-differential signals are used.

Certain communication standards, such as, but not limited to 4G specifications, have relatively stringent spurious emission requirements for transmit signals. However, LO and mixer elements in the transmit signal front end system 100 can be key contributors to transmit non-linearity. Accordingly, in embodiments of the present invention, the LO and mixer elements are configured to have good LO linearity performance to meet those stringent requirements. Additionally, in particular embodiments of the present invention, wireless devices that can also operate in a legacy (e.g., 2G/3G) mode are configured such that the linearity requirements for the 4G or LTE mode do not affect the ability to operate in a non-legacy mode.

The desired signal output frequency of each mixer devices 120 and 140 is flo+fbb. If non-linear devices were used in the front end system 100, such as conventional mixers and local oscillator (LO) devices in place of the adaptable mixer devices 120 and 140 and LO device 170, spurious emissions would result at frequencies corresponding to flo−3*fbb and flo+5*fbb, for example, where fbb is the baseband frequency, flo is the output frequency of the LO and flo+fbb is the desired transmitted signal). Undesired third order harmonics due to nonlinearities in an LO and mixer elements may not be in compliance with 4G specifications. Such nonlinearities can reduce the power of signals at the desired transmit frequencies, while also adding interference to the transmit signals due to the harmonic signals also being output by the front end system 100. More specifically, if conventional mixers are used in place of adaptable mixer devices 120 and 140, the signal input to the driver amplifier 160 includes flo+fbb (F1), as well as third order harmonics flo−3*fbb (F2) and 3*flo−fbb (F3), where 3*fbb is the inherent third order non-linearity of the baseband filters 110, 130 and 3*flo is the third order non-linearity of the LO signal. As a result, inherent nonlinearity in the driver amplifier 160 creates inter-modulation products between F2 and F1 (as 2F2−F1) and between F3 and F1 (as 2F1−F3), both of which result in spurious emissions that can fail to meet desired specifications.

Figure 2:
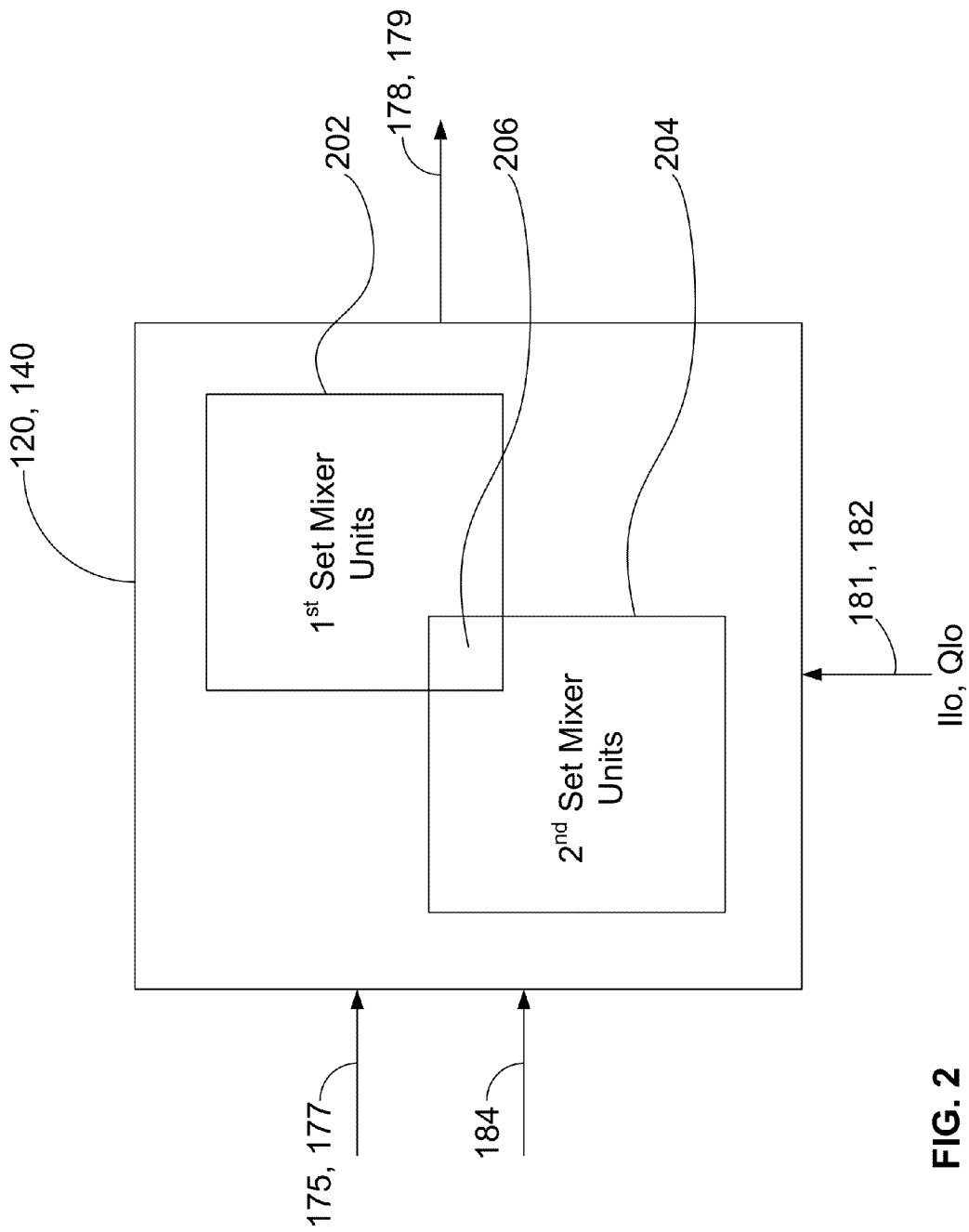
FIG. 2 is block diagram representing an adaptable mixer device according to an embodiment of the present invention.

FIG. 2 shows a generalized circuit configuration of an example implementation of an adaptable mixer device 120, 140 that is operable with a multi-phase LO signal provided on a signal line 181 or 182, according to a first embodiment of the invention. An adaptable mixer device 120, 140 can be provided on each of the I and Q paths of the front end 100 as shown in FIG. 1. In further embodiments, a single mixer device (combining mixer devices 120 and 140 in a single mixer device circuit) may be employed for handling both the I and the Q paths. However, embodiments in the drawings show an adaptable mixer device 120 for the I path and another adaptable mixer device 140 for the Q path. The two adaptable mixer devices 120 and 140 are described herein, together, as they have the same structure and operation (but receive different inputs, namely Idac and Qdac for the I and Q paths, respectively).

Each adaptable mixer device 120, 140 includes a plurality of mixer units that are grouped in multiple sets, where the multiple sets of mixer units correspond in number to the multiple modes of operation of the adaptable mixer device 120, 140. In other words, each set of mixer units is associated with a respective mode of operation. In FIG. 2, the mixer units are arranged in two sets for an adaptable mixer device 120, 140 having dual modes of operation, where the two sets include a first set of mixer units 202 and a second set of mixer units 204. One or more (but not all) of the mixer units in the first set 202 are also included in the second set 204 and are shown in FIG. 2 as the common mixer unit(s) 206. In further embodiments, the adaptable mixer device 120, 140 includes one or more further sets of mixer units (not shown), with one or more shared or common mixer units 206 in the further sets, for one or more further modes of operation.

In a first mode (such as, but not limited to, a non-HRM mode used for legacy systems) of operation of the adaptable mixer device 120, 140 in FIG. 2, the mixer units in the first set 202, including the one or more common mixer unit(s) 206, are operable. However, in the first mode, the mixer units that are in the second set 204 and not in the common mixer unit(s) 206 (i.e., the non-common mixer units of the second set), are not operated.

In a second mode (such as, but not limited to, an HRM mode for 4G or LTE systems) the mixer units in the second set 204, including the one or more common mixer unit(s) 206, are operable. However, in the second mode, the mixer units that are in the first set 202 and not in the common mixer unit(s) 206 (i.e., the non-common mixer units of the first set 202), are not operated. Accordingly, in each given mode of operation, a selected set of mixer units (e.g., the non-common mixer units in the first set 202 or the second set 204) are operable, along with the common mixer unit(s) 206, while each other set of mixer units (those not included in the selected set and common mixer unit(s) 206), is not operated.

The mode of operation of the adaptable mixer device 120, 140 is selected by control signals on control line 184, shown in FIGS. 1 and 2. The control signals on control line(s) 184 are provided to correspond in time with further control signals provided to the local oscillator device 170 on control signal line(s) 183, to provide appropriate phases, respectively, of the local oscillator (LO) output signal to appropriate mixer units within the mixer devices 120, 140, as described below with respect to FIG. 5. In one embodiment described below, the control line 184 provides control signals for controlling the operations of switches to selectively connect or disconnect particular phases of the LO signals from the Ilo and Qlo input signal lines 181 and 182, to inputs of the mixer units. In other embodiments, other suitable ways to selectively operate and not operate mixer units in the first and second sets 202 and 204 may be employed, including circuits for selectively connecting or disconnecting electrical power, selectively connecting or disconnecting output terminals of the mixer units in the circuit, or the like. By selectively controlling the non-common mixer units of one of the first or second sets 202 and 204 to operate (while controlling the common mixer unit(s) 206 to operate with each of first and second sets), the mode of the adaptable mixer device 120, 140 can be selected.

Embodiments of the adaptable mixer device 120, 140 may be configured for use with a multi-phase LO signal, such as, but not limited to, a three-phase LO signal. For example, according to one example embodiment that employs a three-phase LO signal, in a first mode of operation, the first set of mixer units 202, including the common mixer unit(s) 206, are operable and connected to receive an LO signal of a third phase on the signal line 181, 182, while the non-common mixer units in the second set 204 are not operated (for example, not provided with an LO signal). However, in the second mode of operation, at least one first mixer unit of the second set 204 is operable and connected to receive an LO signal of a first phase, and at least one second mixer unit of the second set 204 is operable and connected to receive an LO signal of a second phase, while the non-common mixer units in the first set 202 are not operated (for example, they are not provided with power). In addition, in the second mode, a subset of the mixer units in the first set 202 (i.e., the common mixer unit(s) 206) is operable and coupled to receive the LO signal.

Accordingly, when the adaptable mixer device 120, 140 is operated in a first mode (for example, but not limited to a non-HRM mode for legacy systems), the first set of mixer units 202 (including the common mixer unit(s) 206) are provided with an appropriate phase of the LO signal and are operated, but not the non-common mixer units of the second set 204. When the adaptable mixer device 120, 140 operates in a second mode (for example, but not limited to an HRM mode for 4G or LTE systems), the second set of mixer units 204 (including the common mixer unit(s) 206) are provided appropriate phases of the LO signal and are operated, but not the non-common mixer units of the first set 202.

The adaptable mixer device 120, 140 can selectively adapt (by changing a mode of operation) to accommodate different communication standards and protocols, yet provide a suitably linearity in performance to reduce or avoid spurious emissions. In particular embodiments, the adaptable mixer device 120, 140 provides performance linearity suitable for compliance with 4G and LTE specifications when operating in a 4G and LTE mode, while also providing suitable performance for legacy system specifications in a second mode without adversely affecting the ability to operate with good linearity in the 4G and LTE mode.

Figure 3:
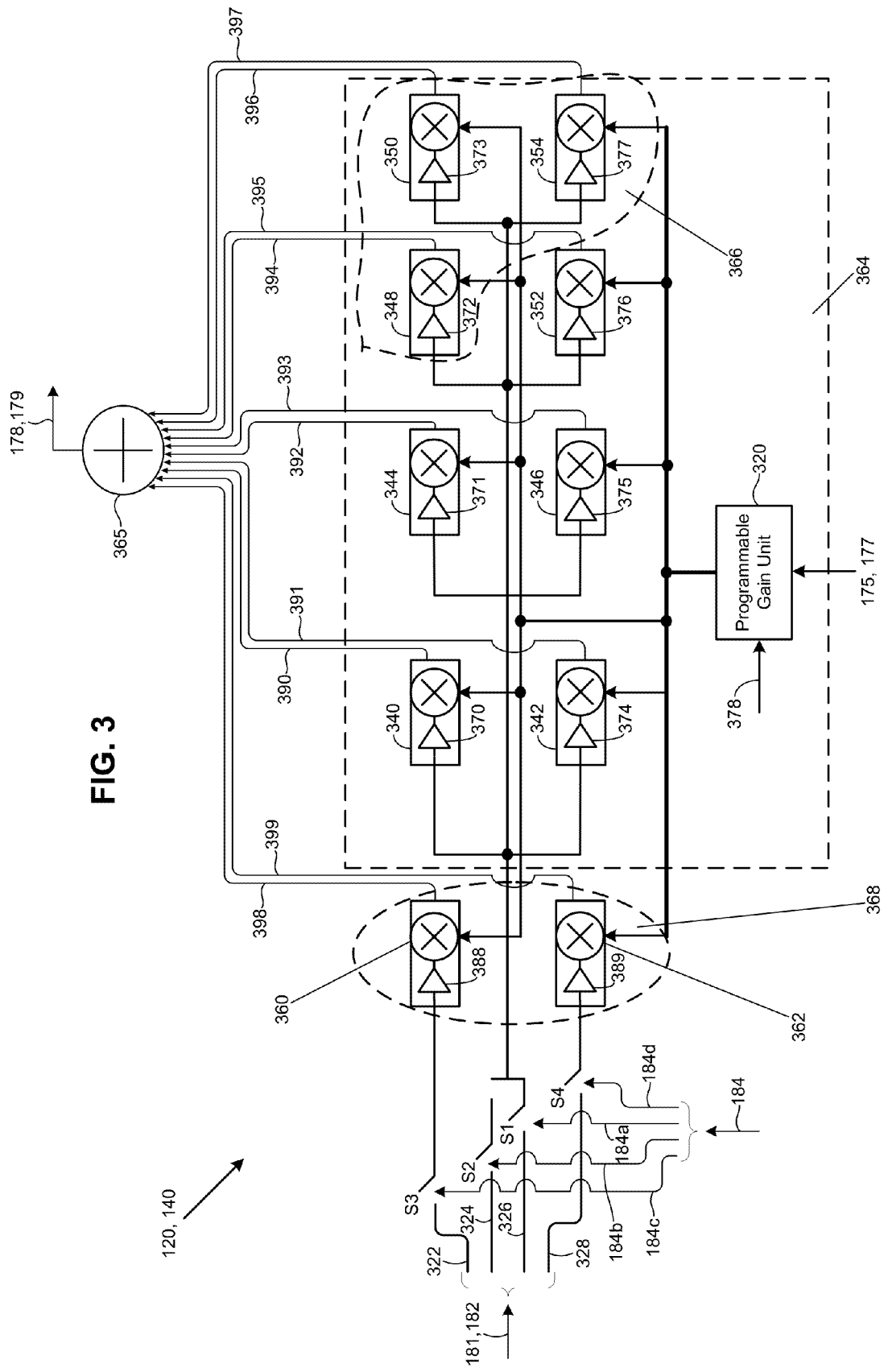
FIG. 3 is a schematic diagram of an adaptable mixer device according to an embodiment of the present invention.

An example configuration of an adaptable mixer device 120, 140 that may be employed for each one of the I path or Q path signal, is shown in FIG. 3. The adaptable mixer device 120, 140 in FIG. 3 includes a plurality of mixer units (discussed below), at least one programmable gain unit 320, a plurality of LO signal input lines 322, 324, 326 and 328 (corresponding to multiple phase input signals on the LO signal line 181, 182 in FIG. 1) for receiving different phases of an LO signal, and a plurality of controllable switches S1-S4 for selectively connecting and disconnecting the input lines 322, 324, 326 and 328 to one or more LO signal sources. For an adaptable mixer device 120 on the I path, the LO signal input lines 322, 324, 326 and 328 correspond to the LO signal input lines 181 (represented by a single line in FIG. 1 for simplifying that drawing). For an adaptable mixer device 140 on the Q path, the LO signal input lines 322, 324, 326 and 328 correspond to the LO signal input lines 182 (also represented as a single line in FIG. 1, for simplification).

In the example of FIG. 3, the adaptable mixer device 120, 140 includes ten mixer units 340, 342, 344, 346, 348, 350, 352, 354, 360 and 362, where each mixer unit includes a mixer and a pre-amp connected at the input of the mixer. The mixer circuit in each mixer unit 340, 342, 344, 346, 348, 350, 352, 354, 360 and 362 may be implemented by a single mixer circuit or multiple mixer circuits. In further embodiments of an adaptable mixer device 120, 140, other suitable numbers of mixer units may be employed. Also, in further embodiments, the pre-amp may be omitted and/or further components may be included in each or some of the mixer units.

The outputs of the mixer units 340, 342, 344, 346, 348, 350, 352, 354, 360 and 362 are connected to output signal lines 390-399, respectively. In one example embodiment, each of the output signal lines 390-399 leads to an adder circuit 365, for adding the outputs of the particular ones of those respective mixer units that are operated to provide an output signal (where, depending upon the mode of operation of the adaptable mixer device 100, certain mixer units will be operated and others will not be operated to provide output signals to the adder circuit 365, as described herein). The adder circuit 365 may provide an output signal on signal lines 178, 179, or may be implemented in the adder 150 of the front end system 100 in FIG. 1.

Of the mixer units shown in FIG. 3, the mixer units 340, 342, 344, 346, 348, 352, 350 and 354 within the region labeled 364 correspond to the first set of mixer units 202 (including the common mixer unit(s) 206) in FIG. 2. The mixer units in the group 366 (i.e., mixer units 348, 350 and 354) correspond to the common mixer(s) 206 in FIG. 2. The mixer units 360 and 362, with the mixer units in the common group 366 (i.e., mixer units 348, 350 and 354) correspond to the second set of mixer units 204 in FIG. 2.

When the adaptable mixer device 120, 140 operates in a first mode (for example, but not limited to, a non-HRM mode used for legacy systems), the mixer units within region 364 (i.e., mixer units 340, 342, 344, 346, 348, 350, 352 and 354) are selected to be operable. When the adaptable mixer device 120, 140 operates in a second mode (for example, but not limited to an HRM mode for 4G or LTE systems), the mixer units within regions 366 and 368 (i.e., mixer units 348, 350, 354, 360 and 362) are selected to be operable while the other mixer units are not operable (for example, they are not provided with any signals to operate on). The adaptable mixer device 120, 140 can provide an advantage of good gain control. Also, the adaptable mixer device 120, 140 does not require a dedicated mixer design for 4G or LTE mode that results in a power consumption penalty when operating in legacy modes.

The size of the mixer in each mixer unit 340, 342, 344, 346, 348, 350, 352, 354, 360 and 362 of the adaptable mixer device 120, 140 is selected, based on desired operational parameters, including output power requirements. In particular embodiments, the mixer units within the first set 202 of FIG. 2 (corresponding to the mixer units within the region 364 in FIG. 3) include mixers of different sizes. In the embodiment of FIG. 3, the region 364 (corresponding to the first set 202) includes a plurality of mixer units of three different size mixers (4×, 2× and 1×), while the mixer units in the region 368 (corresponding to the non-common mixer units of the second set 204) includes a plurality of mixers of one size (2×), and the mixer units in the common region 366 (corresponding to the common mixer unit(s) 206) include a plurality of mixers of one size (1×). However, in other embodiments, other suitable numbers of mixer units and mixer sizes may be employed in the first set 202 (e.g., region 364, including region 366), second set 204 (e.g., regions 368 and 366) and common mixer(s) 206 (e.g., region 366). The power level of the output signal on signal line 178, 179 will depend upon which mixer units sizes are operated.

The embodiment of FIG. 3, the mixer units in region 364 (corresponding to the first set of mixer units 202, including the common mixer unit(s) 206 in FIG. 2) includes two 4×-sized mixers (one for each of the mixer units 340 and 342), two 2×-sized mixers (one for each of the mixer units 344 and 346), and four 1×-sized mixers (one for each of the mixer units 348, 350, 352 and 354). Also in the embodiment of FIG. 3, the mixer units in region 368 (corresponding to the second set of mixer units 204 excluding the common mixer unit(s) 206 in FIG. 2) include two 2×-sized mixers (one for each of mixer units 360 and 362). The size of a mixer is based on the dimension of transistors (e.g., transistor channel width and length dimensions on a semiconductor substrate or wafer) making up the mixer.

The switches S1-S4 are controlled to selectively open and close, based on control signals provided on switch control lines 184a, 184b, 184c and 184d, respectively. The switch control signals on control lines 184a-d correspond to the control signal 184 in FIG. 1 (where the multiple switch control lines are shown as a single line representation in FIG. 1) and are provided by the control unit 188 described above with reference to FIG. 1. The switch control signals on control lines 184a-d are provided in a timed relation with control signals provided on control signal line 183 to the local oscillator (LO) device, to provide appropriate phases of the local oscillator signal 181, 182 to the respective input lines 322, 324, 326 and 328, as described below with reference to FIG. 5. The switches S1-S4 are opened or closed, depending upon the mode of operation of the adaptable mixer device 100. In one example embodiment, the control signals for switches S1-S4 may be set to either a logic 0 or a logic 1 based on whether the adaptable mixer device 120, 140 is to operate in a first mode or a second mode (for example, but not limited to, the HRM mode or the non-HRM mode).

For example, in a first mode of operation (for example, the non-HRM mode for legacy band operation), switch control signals are provided on the control lines 184a-c to cause switch S1 to close, and switches S2, S3 and S4 to open.

With switch S1 closed, a LO signal suitable for a first mode of operation (for example, but not limited to legacy bands) is provided to each of the two 4×-sized mixers in mixer units 340 and 342, two 2×-sized mixers in mixer units 344 and 346, and four 1×-sized mixers in mixer units 348, 350, 352 and 354. The two 2×-sized mixers in mixer units 360 and 362 do not receive any signals, because the switches S3 and S4 are open in the first mode (for example, non-HRM mode). In a first mode (for example a non-HRM mode) switches S3 and S4 each receive a control signal on the control signal lines 184c and 184d, respectively, set to a value (for example, but not limited to "0") to open the switches S3 and S4. However, in a second mode (for example an HRM mode) switches S3 and S4 each receive a control signal on the control signal lines 184c and 184d, set to a value (for example, but not limited to "1") to close the switches S3 and S4. Also, switch S2 receives a control signal on control signal line 184b and switch S1 receives an opposite control setting via control signal on control signal line 184a. In the second mode (for example, an HRM mode), the switch S3 and the switch S2 each receive a control signal set to a value (for example, but not limited to 1), such that the control signal selects the appropriate mixer units and the control signal to switch S2 closes switch S2 to connect appropriate phases (for example, 0, +45 and −45 degree) of the input LO signals, to provide sufficient harmonic rejection.

The signal inputs to the switches S1-S4 are provided by a multi-phase LO device 170, via signal line(s) 181, 182. An example of a multi-phase LO device 170 for providing the multi-phase LO input signals is described, below, in connection with FIG. 5. In an example embodiment, LO signal 322 (for example, but not limited to a +45 degree LO signal from an 8-phase Div 4 circuit) is input to switch S3. LO signal 324 (for example, but not limited to a 0 degree LO signal from an 8-phase Div 4 circuit) is input to switch S2. LO signal 326 (for example, but not limited to a 0 degree LO signal from a 4-phase Div 4 circuit) is input to switch S1. LO signal 328 (for example, but not limited to a −45 degree LO signal from an 8-phase Div 4 circuit) is input to switch S4. Switch S1 and switch S2 are each connected to the inputs of the mixers in the mixer units 340, 342, 344, 346, 348, 350, 352 and 354, through pre-amps 370-387, respectively. Switch S3 is connected to the mixer in mixer unit 360, through pre-amp 388, and switch S4 is connected to the mixer in mixer unit 362, through pre-amp 389. The pre-amps 370-389 amplify the LO signal that is input to the one or more mixers within each mixer unit.

FIG. 3 also shows a programmable gain unit 370 (also referred to as a variable gain stage). The programmable gain unit 370 provides an appropriately scaled current to the two 4×-sized mixers 340, 342, two 2×-sized mixers 344, 346, and four 1×-sized mixers 348, 350, 352, 354 (corresponding to a total of 4×+4×+2×+2×+1×+1×+1×+1×=16× in mixer size) when the adaptable mixer device 120, 140 is operating in a first mode (for example, but not limited to the non-HRM mode). The programmable gain unit 320 has a gain that can be set to any suitable value, based on a control signal on a control signal line. The control signal on control signal line 378 may be provided by suitable control electronics, such as, but not limited to, processing electronics (not shown) associated or connected with the front end system 100 (FIG. 1). The programmable gain unit 320 receives a filtered signal on signal line 175, 177 from a baseband filter (for example, the baseband filter 110 or 130 in FIG. 1), and converts the filtered signal voltage to a current signal at a gain set by the programmable gain unit 320.

In the second mode (such as, but not limited to the HRM mode) of the adaptable mixer device 120, 140, switch S1 is open, and switches S2, S3 and S4 are closed. The signal line 322 on which switch S3 is provided, receives a +45 degree LO signal output by a multi-phase LO for use in the second mode (for example, the HRM mode). The signal line 324 on which switch S2 is provided, receives a 0 degree LO signal output by the multi-phase LO for use in the second mode (for example, the HRM mode). The signal line 328 on which switch S4 is provided, receives a −45 degree LO signal output by the multi-phase LO for use in the second mode (for example, the HRM mode). In the second mode (for example, the HRM mode), the +45 degree LO signal is provided to the 2×-sized mixer in mixer unit 360, and the −45 degree LO signal is provided to the 2×-sized mixer in mixer unit 362. Also, in the second mode (for example, HRM mode), the 0 degree LO signal provided when the switch S2 is closed, is provided to the 1×-sized mixers in mixer units 348, 350 and 354. Note that, in the second mode (for example, the HRM mode) of the adaptable mixer device 120, 130, the 1×-sized mixer in mixer unit 352 does not provide any output, the two 4×-sized mixers in mixer units 340 and 342 do not provide any output, and the two 2×-sized mixers in mixer units 344 and 346 do not provide any output. In particular, each mixer unit 340, 342, 344, 346, 348, 352, 350, 354, 360 and 389 is provided with a power signal (for powering the pre-amplifier in the mixer unit, the mixer circuit(s) in the mixer units, or both), where the power signal can be selectively turned off, to selectively disable the mixer unit. Accordingly, the adaptable mixer device 120, 140 includes (or is connected with) appropriate power circuitry for selectively providing electrical power to each of the mixer units (or each pre-amplifier and mixer circuit in each of the mixer units). The power circuitry may be controlled by suitable control electronics included with or associated with the control unit 188 (FIG. 1) and/or processing electronics associated with the front end system 100.

Similar to operation of the legacy mode, the programmable gain unit 320 applies a suitable gain value to an input voltage, and provides an appropriate output current to the 1×-sized mixers and the 2×-sized mixers operating in the second mode (for example, HRM mode). With the programmable gain unit 320, gain control can be utilized in the second mode (for example, the HRM mode). In the second mode (for example, HRM mode), the adaptable mixer device 120, 140 operates with a resulting ratio of 2:3:2, which is close to the ideal 1:√2:1 ratio of a dedicated HRM mixer. Referring also to FIG. 3, the first "2" in the above-noted ratio corresponds to the 2×-sized mixer in mixer unit 360, the "3" in the ratio corresponds to the combination of the 1×-sized mixers in mixer units 348, 350, 352, and the last "2" in the ratio corresponds to the 2×-sized mixer in mixer unit 362. In an alternative implementation of an adaptable mixer device 120, 140, other suitable ratios may be achieved by choosing suitable sizes for the mixers. For example, a ratio of 1:√2:1 may be obtained by choosing suitable sizes of the mixers. Alternatively, the mixers in mixer units 348, 350 and 354 may have a combined size of 2√2, to obtain a ratio of 2:2√2:2, which is the same as the above-noted ideal ratio of 1:√2:1.

Figure 4:
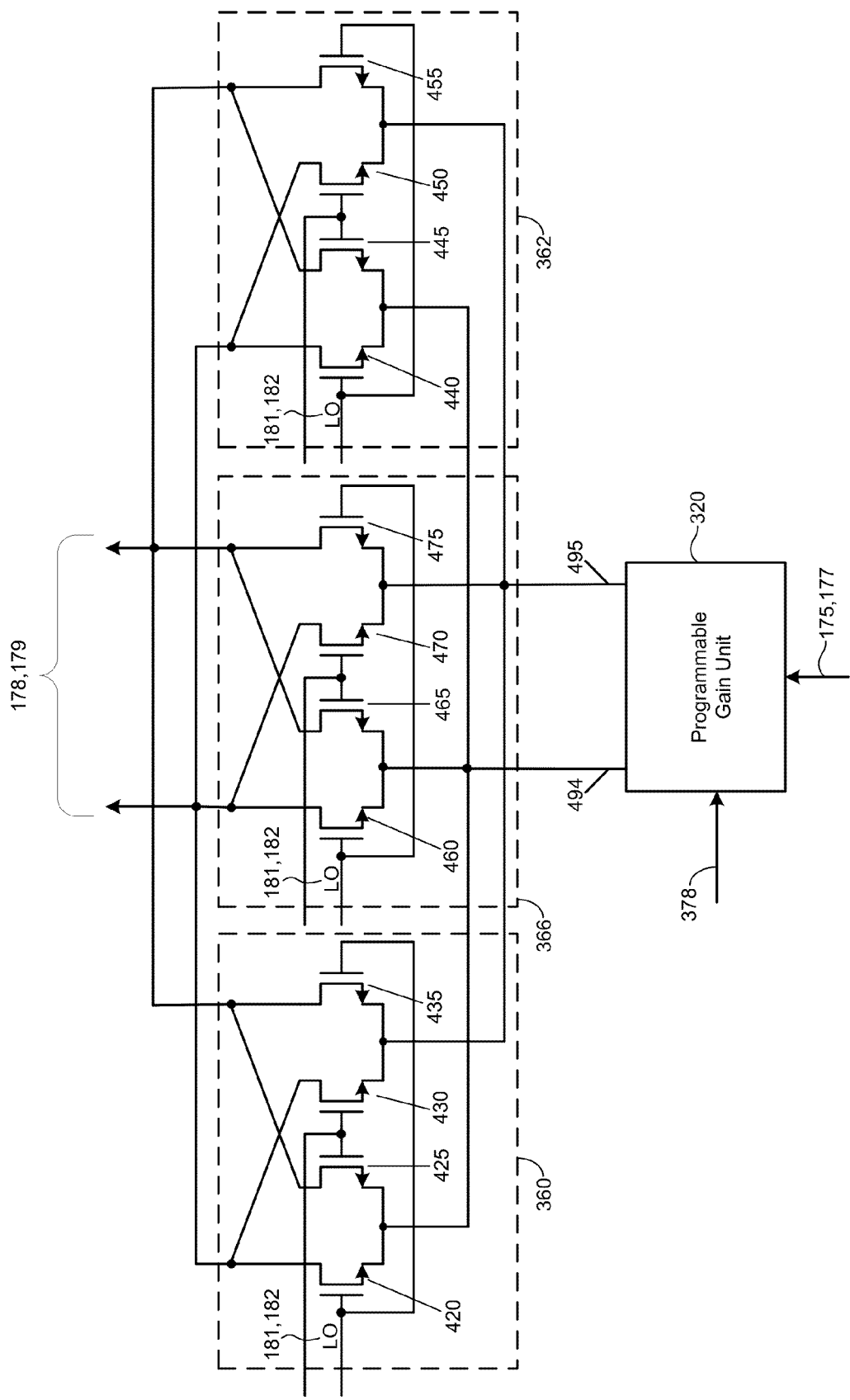
FIG. 4 is a transistor-level circuit diagram of an adaptable mixer device operating an a second mode, according to an embodiment of the present invention.

FIG. 4 shows an example embodiment of a transistor configuration for an adaptable mixer device 120, 130 of FIG. 3, when operating in the second mode (for example, the HRM mode), where the mixer units in FIG. 3 that are not provided with an LO signal in the second mode (for example, the HRM mode) are not shown in FIG. 4.

The programmable gain unit 320 in FIG. 4 may be composed of any suitable programmable gain circuit. For example, the programmable gain unit 320 may include, but is not limited to, a bank of switched transistors that are selectively switched on or off, based on one or more control signals on the control line 378, to provide a different output gain, depending upon which transistors are on and off.

The programmable gain unit 320 converts a baseband signal received on signal line 175, 177 from a baseband filter (e.g., base band filter 110 or 130 in FIG. 1) into a current, for application to the mixers of the mixer units in the adaptable mixer device 120, 140. In FIG. 4, the output of the baseband filter 110, 130 (which, in differential signal embodiments, is a differential signal) is represented by signal line 175, 177 and is input to the programmable gain unit 320. The programmable gain unit 320 sets that signal to a desired level in order to achieve a desired gain, based on the control signal 378, and provides a differential output signal on signal lines 494 and 495. The differential output signal on signal lines 494 and 495 correspond to the differential signal from the base band filter 110, 130, at a gain set in accordance with the control signal 378.

The four transistors 420, 425, 430 and 435 in FIG. 4 correspond to the mixer unit 360 in FIG. 3. Similarly, the four transistors 440, 445, 450 and 455 in FIG. 4 correspond to the mixer unit 362 in FIG. 3. In one example embodiment as described above, each of the mixers 360 and 362 is a 2× sized mixer. Additionally, the four transistors 460, 465, 470 and 475 in FIG. 4 correspond to the mixer units within region 366 (e.g., the three mixer units 348, 350, 354) of FIG. 3 that are operable in the second mode (for example, the HRM mode) of the adaptable mixer device 120, 140.

As shown in FIG. 4, the drains of transistors 420, 430, 460, 470, 440 and 450 are connected to each other, and the drains of transistors 425, 435, 445, 455, 465 and 475 and connected to the adder 365 in FIG. 3 (or 150 in FIG. 1). Also as shown in FIG. 4, the sources of transistors 420, 425, 440, 445, 460 and 465 are connected to each other, and are further connected to one of the sides 494 of the differential output signal line from the programmable gain unit 320. The sources of transistors 430, 435, 450, 455, 470 and 475 are connected to each other, and are further connected to the other side 495 of the differential output signal line from the programmable gain unit 320. The gates of the transistors 420, 425, 430, 435, 440, 445, 450, 455, 460, 465, 470 and 475 are connected to receive the multiphase LO signal input discussed above. In one example embodiment, transistors 420, 425, 430 and 435 are connected to receive the +45° LO signal, the gates of transistors 460, 465, 470 and 475 are connected to receive the +0° LO signal, and the gates of transistors 440, 445, 450 and 455 are connected to receive the −45° LO signal.

In one example embodiment, each of the transistors 420, 425, 430, 435 has a size equal to 2 (W/L), and each of the transistors 440, 445, 450, 455 has a size equal to 2 (W/L), in which W is the width of the transistor on a substrate and L is the length of a transistor channel on a semiconductor substrate or wafer. Additionally, the size of each of the transistors 460, 465, 470, 475 is equal to 3 (W/L). However, in other embodiments, transistors with other suitable sizes may be selected.

In the configuration as shown in FIG. 4, the baseband current is split in accordance with an aspect ratio of the mixer devices, for example, but not limited to an aspect ratio of 2:3:2. The aspect ratio is selected in accordance with the desired mode of operation. An aspect ratio of 2:3:2 can provide a desired HRM (non-legacy) mode operation. Additionally gain control can be utilized in the non-legacy mode (and also in the legacy mode). By utilizing a programmable gain unit 320 in the adaptable mixer device 120, 140, in accordance with embodiments of the invention, gain can be changed either along with switch size (e.g., in the non-HRM mode) or independently (e.g., in the HRM mode), resulting in a more flexible mixer that can operate well in either mode. Also, the adaptable mixer device 120, 140 can adaptively select harmonic rejection or non-rejection operation based on the mode and, thus, operates in a more linear manner than conventional mixers, to improve the transmit operation and capability of meeting stringent 4G-LTE specifications. In addition, a highly-linear adaptable mixer device 120, 130 allows other elements in a front end, such as a baseband filter, to be relieved of their stringent linearity requirements to some extent, and still be able to meet the stringent 4G-LTE specifications, yet also operate well in legacy (non-HRM) mode.

Figure 5:
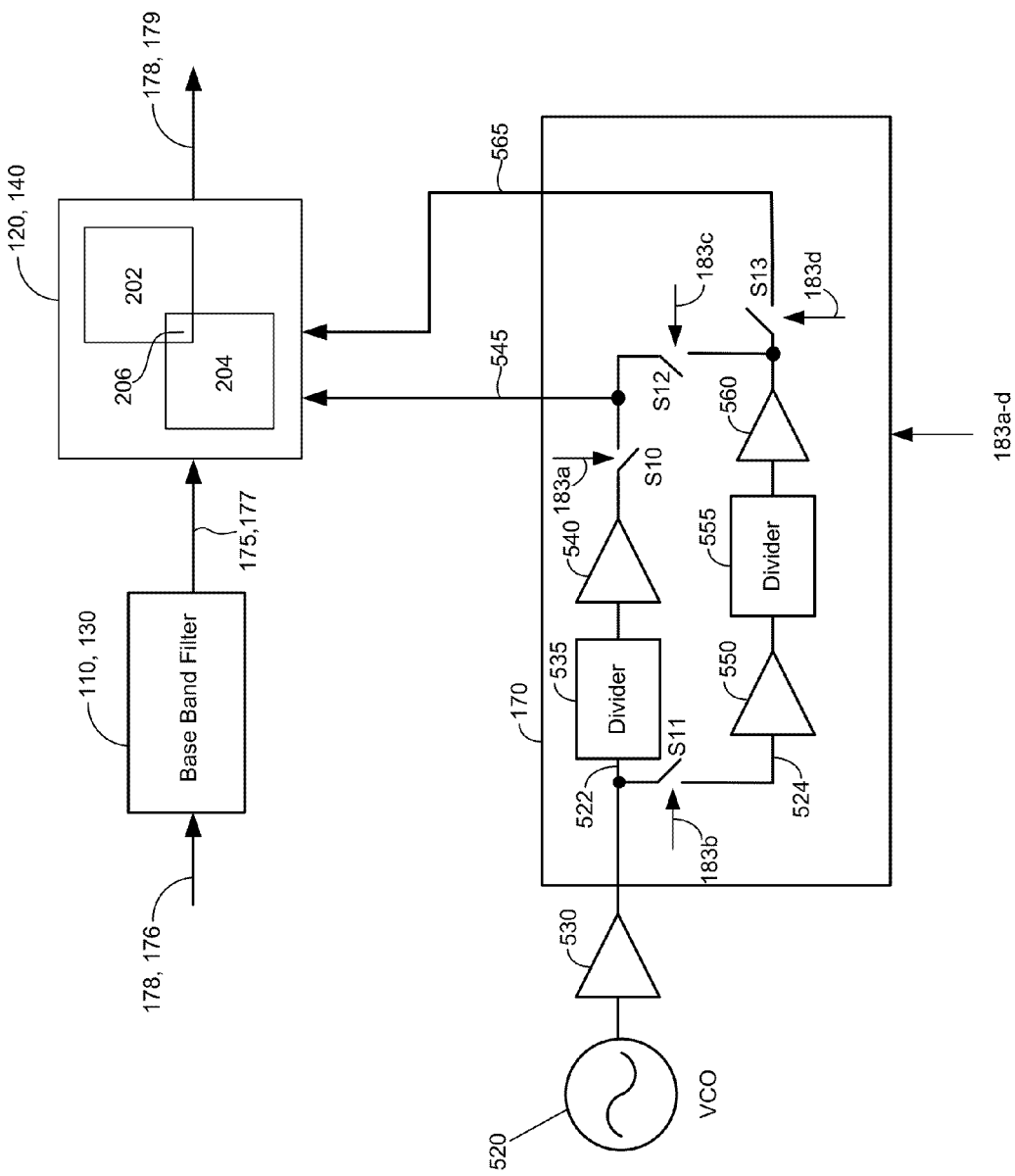
FIG. 5 is a block diagram showing a connection circuit connecting a multi-phase LO with an adaptable mixer device, according to an embodiment of the present invention.

FIG. 5 shows an example embodiment of a local oscillator (LO) device 170 for connecting a multi-phase VCO 520 to the adaptable mixer device 120, 140, for example, in a front end system 100 of FIG. 1. In FIG. 5, the adaptable mixer device 120, 140 is represented by a diagram showing the first set of mixer units 202 and the second set of mixer units 204, consistent with FIG. 2 (where the common region corresponds to the common mixer unit(s) 206 of the first and second sets. In one embodiment, as described herein, the sizes of the mixer units within the first and second sets of mixer units 202 and 204 are selected such that the first set of mixer units 202 (including the common mixer unit(s) 206) corresponds to the mixer units that are selectively operable in a first mode (such as, but not limited to, a legacy mode) of operation. Similarly, the mixer units 204 (including the common mixer unit(s) 206) correspond to the mixer units operable in a second mode (such as, but not limited to, an HRM mode) of operation.

The local oscillator (LO) device 170 includes a first signal path 522 and a second signal path 524. The first signal path 522 is connected to the output of a VCO buffer 530, to the receive an oscillating signal from the VCO 520, through the VCO buffer 530. The second signal path 524 is connected to the output of the VCO buffer 530, through a switch S11.

In the first signal path 522 of the local oscillator (LO) device 170, the output of the VCO buffer 530 is connected to the input of a divider circuit 535, such as, but not limited to a divide-by-4 circuit. The output of the divider circuit 535 is connected to the input of a buffer 540 and the output of the buffer 540 is connected to an output line 545, through a switch S10.

In the second signal path 524, the output of the VCO buffer 530 is connected (through the switch 511) to the input of a buffer 550. The output of the buffer 550 is connected to the input of a divider circuit 555, such as, but not limited to a divide-by-4 circuit. The output of the divider circuit 555 is connected to the input of a buffer 560. The output of buffer 560 is connected to an output line 565, through a switch 513. A switch 512 is connected between the output line 545 and the output of the buffer 560. The switches 510, 511, 512 and 513 in FIG. 5 are controlled by suitable control signals on switch control lines 183a, 183b, 183c, 183d (corresponding to the control signal line(s) 183 in FIG. 1), respectively, to open and close in the manner discussed below. The switch control signals are provided by a switch control unit 188, as discussed above.

The VCO 520 outputs an oscillation signal, by way of a VCO buffer 530, to the first path 522 and the second path 524. On a first path, the oscillation signal is divided by the divide-by circuit 535 (for example, a Divide-by-4 circuit), and then buffered by the buffer 540. The buffered signal is provided to the first set of mixer units 202, including the common mixer unit(s) 206 of the adaptable mixer device 120, 140, for example, according to the connection arrangement shown in FIGS. 3 and 4, for operation in a first mode (for example, but not limited to a legacy mode).

On the second path 524, the oscillation signal is buffered by the buffer 550, then divided by the divide-by circuit 555 (for example, a Divide-by-4 circuit), and then buffered by a buffer 560. The buffered signal is provided to the second set of mixer units 204, including the common mixer unit(s) 206, for example, according to the connection arrangement shown in FIGS. 3 and 4, for operation in a second mode (for example, but not limited to an HRM mode).

The output signal lines 545 and 565 in FIG. 5, each represent multiple signal lines for multiple respective phases of the LO signals. Thus, as shown in FIG. 3, four separate LO signals are provided by the connection circuit 510 to either the first and second sets of mixer units 202 and 204 of the adaptable mixer device 120, 140, depending upon the selected mode of operation.

The switch S10 is provided on the first path, between the output of the buffer 540 and the output line 545. The switch S10 is closed in the first mode (for example, a non-HRM mode) and is open in the second mode (for example, an HRM mode). The switches S11, S12 and S13 are provided on the second path, where the switch S11 is provided between the output of the VCO buffer 530 and the input of the buffer 550. The switch S12 is provided between the output of the buffer 560 and the output line 545. The switch 513 is provided between the output of the buffer 560 and the output line 565. The switches S11 and S13 are open in the first mode (for example, the non-HRM mode) and are closed in the second mode (for example, the HRM mode) of the adaptable mixer device 120, 140.

Thus, in the second mode (for example, the HRM mode) the second path 524 is connected to the second set of mixer units 204 (including the common mixer unit(s) 206). However, in the first mode (for example, the non-HRM or legacy mode) the second path 524 is disconnected from the non-common mixer units of the second set of mixer units 204. Switch S12 is open in the first mode (for example, the non-HRM mode) and closed in the second mode (for example, the HRM mode). Thus, in the second mode (for example, the HRM mode), the first path is not connected to the non-common mixer units of the first set of mixer units 202.

FIG. 5 also shows the adaptable mixer device 120, 140 connected to receive output signals from the baseband filter 110, 130 of FIG. 1. The output signal from the baseband filter 110, 130 is mixed by the adaptable mixer device 120, 140 with the LO signal(s) output by the VCO 520.

As shown in FIG. 5, a flexible LO/mixer structure can be obtained, which provides a divide-by-4 with 4-phases for non-HRM mode, and a divide-by-4 with eight phases (e.g., 45 degree opposite phases) for HRM mode. As such, a mixer/LO combination can be obtained, which provides for high linearity in the HRM mode, without sacrificing performance in non-HRM mode. Also, the dual-mode structure provides the capability to turn off the HRM mode at lower power output (e.g., where spurious emissions specifications are relaxed), to save on power consumption, to provide for an adaptive mixer/LO structure (e.g., disable the HRM mode when not required). It further provides for gain control that is independent of HRM operation.

By utilizing a variable gain stage with the adaptable mixer device 120, 140, gain can be changed either along with switch size (e.g., in the non-HRM mode) or independently (e.g., in the HRM mode). Also, the adaptable mixer device 120, 140 provides for adaptively selecting harmonic rejection or non-rejection operation, based on the mode utilized. Still further, the adaptable mixer device 120, 140 relieves the baseband filter 110, 130 of its stringent linearity requirements to some extent, due to the excellent linearity characteristics in some embodiments.

Figure 6:
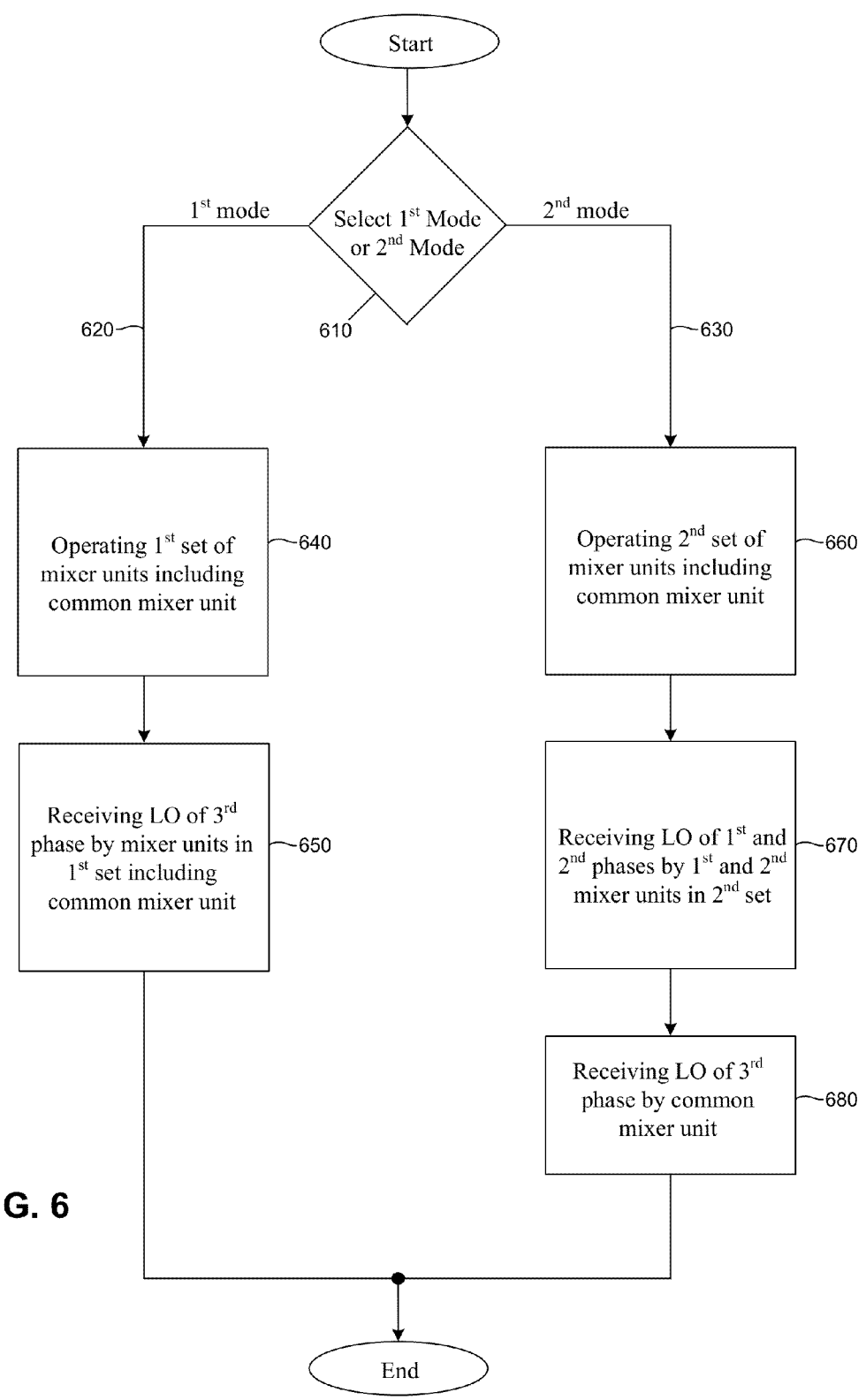
FIG. 6 is a flow diagram showing a method of operating a dual mode mixer having a first mode and a second mode, according to an embodiment of the present invention.

FIG. 6 is a flow diagram of a method 600 of operating a mixer device in a first mode and in a second mode, according to an embodiment of the invention. A method 600 as represented in FIG. 6 may be employed for operating an adaptable mixer device 120, 140 described above, where the mixer device 120, 140 includes a first set of mixer units 202 and a second set of mixer units 204, where the second set of mixer units has at least one mixer unit 206 that is common to both the first set of mixer units and the second set of mixer units, as described above with reference to FIG. 2.

According to the method 600 of FIG. 6, at stage 610, one of the first mode of operation or the second mode of operation of the adaptable mixer device 120, 140 is selected. This selection may be made, for example, but not limited to, by a user-activated switch or other operator (not shown) on a wireless device that includes a front-end system as shown in FIG. 1. Alternatively, this selection may be made by suitable electronics included in a wireless device that has the front-end system of FIG. 1 where, for example, the selection is made in response to an electronic detection of the communication networks and protocols currently available to a wireless device. Alternatively, the mode selection may be made by suitable electronics in the wireless device operating to select and/or change modes at predefined times, for example, to scan plural modes. In other embodiments, the mode selection is made in other suitable manners.

The mode selection stage 610 in FIG. 6 involves the selection between two modes, a first mode (represented by path 620 in the flow diagram) and a second mode (represented by path 630 in the flow diagram). However, in further embodiments, the selection stage 610 may involve a selection from among more than two modes of operation. Upon selecting the first mode of operation (path 620), the first set of mixer units (represented as 202 in FIG. 2) and the common mixer unit(s) (represented as 206 in FIG. 2) are operated, as shown at stage 640. In addition, each of those mixer units receives a local oscillator (LO) signal of a third phase, as shown at stage 650.

Upon selecting the second mode of operation (path 630), the second set of mixer units (represented as 204 in FIG. 2) and the common mixer unit(s) (represented as 206 in FIG. 2) are operated, as shown at stage 660. In addition, a local oscillator (LO) signal of a first phase is received by a first one of the mixer units that is in the second set of mixer units, but not a common mixer unit, as shown at stage 670. Similarly, a local oscillator (LO) signal of a second phase is received by a second one of the mixer units that is in the second set of mixer units, but not a common mixer unit, also shown at stage 670. Further, in the second mode (path 630), a local oscillator (LO) signal of the third phase is received by the common mixer unit(s) (represented as 206 in FIG. 2).

The method 600 of FIG. 6 may end after the appropriate mixer units are operated for a desired time, while receiving appropriate phases of the local oscillator (LO) signal. Alternatively, the method may return to the mode selection stage 610, after completion of one of the mode paths 620 and 630, to allow selection of a mode for further operation.

It is understood that the specific order or hierarchy of steps in the processes disclosed is an example of exemplary approaches. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and Blu-Ray disc where disks usually reproduce data magnetically, while discs reproduce data optically with lasers. Combinations of the above should also be included within the scope of computer-readable media.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. For example, although one combination of mixers utilized in the HRM mode of the dual mode mixer is of a ratio 2:3:2, the number of combinations could be many more, such as 2:4:2 or 2:6:2, while remaining within the spirit and scope of the invention (although these ratios result in less optimal, but still useful, operation in the HRM mode). Thus, the present disclosure is not intended to be limited to the embodiments shown herein but is to be accorded the widest scope consistent with the principles and novel features disclosed herein.

What is claimed is:

1. An adaptable mixer device operable in a first mode and a second mode, comprising:
    a first set of mixer units operable in the first mode; and
    a second set of mixer units operable in the second mode, wherein the second set comprises at least one mixer unit that is also in the first set, the second set of mixer units including a plurality of mixer units that are not in the first set of mixer units, and the first set of mixer units including a plurality of mixer units that are not in the second set of mixer units, wherein each of the mixer units receives a local oscillator (LO) signal, wherein the adaptable mixer device produces an output frequency, wherein the output frequency is configured for a first communication standard when the adaptable mixer device operates in the first mode, and wherein the output frequency is configured for a second communication standard when the adaptable mixer device operates in the second mode.

2. The adaptable mixer device of claim 1, wherein:
    the plurality of mixer units in the second set of mixer units but not in the first set of mixer units are not operable in the first mode;
    the plurality of mixer units in the first set of mixer units and that are not in the second set of mixer units are not operable in the second mode; and
    the at least one mixer unit that is common to both the first set of mixer units and the second set of mixer units is operable in both the first and second modes.

3. The adaptable mixer device according to claim 1, wherein the first mode is a non-harmonic-rejection mixer mode, and wherein the second mode is a harmonic-rejection-mixer mode.

4. The adaptable mixer device of claim 1, wherein:
    the second set of mixer units includes a first mixer unit and a second mixer unit that, in the second mode but not the first mode, are arranged to receive LO signals of a first phase and LO signals of a second phase, respectively;
    a plurality of the mixer units of the first set are arranged to receive LO signals of a third phase in the first mode; and
    at least one mixer unit of the plurality of the mixer units of the first set that are arranged to receive LO signals in the first mode is common to both the first set of mixer units and the second set of mixer units, and is also arranged to receive LO signals of the third phase in the second mode.

5. The adaptable mixer device according to claim 4, wherein the LO signal of the first phase is a +45 degree LO signal, wherein the LO signal of the second phase is a −45 degree LO signal, and wherein the LO signal of the third phase is a 0 degree LO signal.

6. The adaptable mixer device according to claim 4, wherein:
    each mixer unit includes at least one mixer;
    in the second mode, each mixer provided with the first phase and each mixer provided with the second phase is a first size, and each mixer provided with the third phase is a second size, wherein the first size and the second size are positive integer values different from each other.

7. The adaptable mixer device according to claim 6, wherein the plurality of mixer units that are coupled to receive the LO signal of the third phase in the first mode comprise:
a pair of mixers of a first size;
a pair of mixers of a second size that is different from the first size; and
a plurality of mixers of a third size that is different from each of the first and second sizes.

8. The adaptable mixer device according to claim 7, wherein the first size is greater than the second size, and wherein the second size is greater than the third size.

9. The adaptable mixer device according to claim 7, wherein the first, second and third sizes have a size ratio of 4:2:1.

10. The adaptable mixer device according to claim 7, wherein a subset of the plurality of mixers of the third size are operable in the second mode.

11. The adaptable mixer device according to claim 1, further comprising:
a programmable gain unit that converts voltage to current and that provides the current to the mixer units.

12. The adaptable mixer device of claim 1, wherein the first standard is one of a 2G and a 3G standard, and wherein the second standard is one of a 4G standard and a Long Term Evolution (LTE) standard.

13. The adaptable mixer device of claim 1, wherein the adaptable mixer device is configured to meet linearity requirements of the second standard while continuing to operate in the first standard.

14. The adaptable mixer device of claim 1, wherein mixer units in the second set produce signals with reduced third order harmonics compared to mixer units in the first set.

15. A method of operating an adaptable mixer device in a first mode and in a second mode, the adaptable mixer device including a first set of mixer units, and a second set of mixer units, wherein the second set comprises at least one mixer unit that is also in the first set, the method comprising:
configuring the first set of mixer units to operate in the first mode; and
configuring the second set of mixer units to operate in the second mode;
wherein the second set of mixer units includes a plurality of mixer units that are not in the first set of mixer units, and the first set of mixer units includes a plurality of mixer units that are not in the second set of mixer units, wherein each of the mixer units receives a local oscillator (LO) signal, wherein the adaptable mixer device produces an output frequency, wherein the output frequency is configured for a first communication standard when the adaptable mixer device operates in the first mode, and wherein the output frequency is configured for a second communication standard when the adaptable mixer device operates in the second mode.

16. The method of claim 15, further comprising:
operating the plurality of mixer units in the second set of mixer units but not in the first set of mixer units, in the second mode;
operating the plurality of mixer units in the first set of mixer units but not in the second set of mixer units, in the first mode; and
operating the at least one mixer unit that is common to both the first set of mixer units and the second set of mixer units in both the first and second modes.

17. The method according to claim 16, wherein the first mode is a non-harmonic-rejection mixer mode, and wherein the second mode is a harmonic-rejection-mixer mode.

18. The method of claim 16, wherein the second set of mixer units comprises a first mixer unit and a second mixer unit, and further comprising:
receiving LO signals of a first phase by the first mixer unit in the second mode but not the first mode;
receiving a LO signals of a second phase by the second mixer unit in the second mode but not the first mode;
receiving, in the first mode, LO signals of a third phase by a plurality of mixer units in the first set of mixer units; and
receiving, in both the first mode and the second mode, LO signals of the third phase by at least one mixer unit of the mixer units that are arranged to receive LO signals in the first mode.

19. The method according to claim 18, wherein the LO signal of the first phase is a +45 degree LO signal, wherein the LO signal of the second phase is a −45 degree LO signal, and wherein the LO signal of the third phase is a 0 degree LO signal.

20. The method according to claim 18, wherein:
each mixer unit includes at least one mixer;
in the second mode, each mixer provided with the first phase and each mixer provided with the second phase is a first size, and each mixer provided with the third phase is a second size, wherein the first size and the second size are positive integer values different from each other.

21. The method according to claim 18, further comprising coupling plurality of mixer units to receive the LO signal of the third phase in the first mode.

22. The method according to claim 15, further comprising connecting a programmable gain unit to convert voltage to current and provide the current to the mixer units.

23. An adaptable mixer device operable in a first mode and a second mode and having first set of mixer units, and a second set of mixer units, wherein the second set comprises at least one mixer unit that is also in the first set, the adaptable mixer device comprising:
means for configuring the first set of mixer units to operate in the first mode; and
means for configuring the second set of mixer units to operate in the second mode;
wherein the second set of mixer units includes a plurality of mixer units that are not in the first set of mixer units, and the first set of mixer units includes a plurality of mixer units that are not in the second set of mixer units, wherein each of the mixer units receives a local oscillator (LO) signal, wherein the adaptable mixer device produces an output frequency, wherein the output frequency is configured for a first communication standard when the adaptable mixer device operates in the first mode, and wherein the output frequency is configured for a second communication standard when the adaptable mixer device operates in the second mode.

24. The adaptable mixer device of claim 23, wherein the first mode is a non-harmonic-rejection mixer mode, and wherein the second mode is a harmonic-rejection-mixer mode.

25. The adaptable mixer device of claim 23, further comprising:
means for receiving LO signals of a first phase by the first mixer unit in the second mode but not the first mode;
means for receiving LO signals of a second phase by the second mixer unit in the second mode but not the first mode;

means for receiving, in the first mode, LO signals of a third phase by a plurality of mixer units in the first set of mixer units; and means for receiving, in both the first mode and the second mode, LO signals of the third phase by at least one mixer unit of the mixer units that are arranged to receive LO signals in the first mode.

26. The adaptable mixer device according to claim 25, wherein the LO signal of the first phase is a +45 degree LO signal, wherein the LO signal of the second phase is a −45 degree LO signal, and wherein the LO signal of the third phase is a 0 degree LO signal.

27. The adaptable mixer device according to claim 25, wherein:

each mixer unit includes at least one mixer;

in the second mode, each mixer provided with the first phase and each mixer provided with the second phase is a first size, and each mixer provided with the third phase is a second size, wherein the first size and the second size are positive integer values different from each other.

28. A non-transitory computer readable medium configured to control operation of a mixer apparatus having a common mixer unit in either a first mode or in a second mode, the mixer apparatus including a first set of mixers of a first size, a first pair of mixers of a second size greater than the first size, a second pair of mixers of the second size, and a pair of mixers of a third size greater than the second size, the computer readable medium storing computer program product which, when executed by a computer, causes the computer to perform the functions of:

operating the mixer apparatus in a first mode by:

applying a first selected LO output signal of a first phase to one of the pair of mixers of the second size;

applying a second selected LO output signal of a second phase to the other of the pair of mixers of the second size;

applying a third selected LO output signal of a third phase to a subset of the pair of mixers of the first size; and operating the mixer apparatus in a second mode by:

applying the third selected LO output signal of the third phase to each of the mixers of the first size, to the pair of mixers of the third size, and to the second pair of mixers of the second size.

29. The non-transitory computer readable medium according to claim 28, wherein the first, second and third sizes have a size ratio of 4:2:1.

30. A computer-program product for controlling a mixer apparatus, the computer-program product comprising a non-transitory computer-readable medium having instructions thereon, the instructions comprising:

code for causing the mixer apparatus to operate only a first set of mixer units in a first mode; and code for causing the mixer apparatus to operate only a second set of mixer units in a second mode, wherein the second set comprises at least one mixer unit that is also in the first set, wherein the first set comprises multiple mixer units that are not in the second set, and wherein the second set comprises multiple mixer units that are not in the first set, wherein each of the mixer units receives a local oscillator (LO) signal, wherein the mixer apparatus produces an output frequency, wherein the output frequency is configured for a first communication standard when the mixer apparatus operates in the first mode, and wherein the output frequency is configured for a second communication standard when the mixer apparatus operates in the second mode.

\* \* \* \* \*